US008536872B2

(12) United States Patent
Ueda et al.

(10) Patent No.: US 8,536,872 B2
(45) Date of Patent: Sep. 17, 2013

(54) APPARATUS FOR ESTIMATING CHARGED STATE OF ON-VEHICLE BATTERY

(75) Inventors: Kenzi Ueda, Nagoya (JP); Naoki Yamamoto, Aichi-ken (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 969 days.

(21) Appl. No.: 12/265,767

(22) Filed: Nov. 6, 2008

(65) Prior Publication Data

US 2009/0115419 A1 May 7, 2009

(30) Foreign Application Priority Data

Nov. 6, 2007 (JP) .................................. 2007-288283

(51) Int. Cl.
*H02J 7/00* (2006.01)
(52) U.S. Cl.
USPC .......................................... 324/430; 320/132
(58) Field of Classification Search
USPC ........................................................ 324/430
See application file for complete search history.

(56) References Cited

U.S. PATENT DOCUMENTS

| 7,733,063 | B2 * | 6/2010 | Mizuno et al. | 320/136 |
| 7,805,264 | B2 * | 9/2010 | Mizuno et al. | 702/64 |
| 2007/0200567 | A1 * | 8/2007 | Mizuno et al. | 324/430 |
| 2009/0088994 | A1 * | 4/2009 | Machiyama et al. | 702/63 |
| 2009/0171600 | A1 * | 7/2009 | Machiyama | 702/63 |

FOREIGN PATENT DOCUMENTS

| JP | 10-341502 | 12/1998 |
| JP | 2001-304008 | 10/2001 |
| JP | 2002-168929 | 6/2002 |
| JP | 2002-343444 | 11/2002 |
| JP | 2005-001469 | 1/2005 |
| JP | 2006-258070 | 9/2006 |
| JP | 2007-223530 | 9/2007 |

OTHER PUBLICATIONS

Machine Translation for JP 10-341502 A.*
Japanese Office Action dated Oct. 27, 2009, issued in corresponding Japanese Application No. 2007-288283, with English translation.

* cited by examiner

*Primary Examiner* — Ramy Ramadan
(74) *Attorney, Agent, or Firm* — Nixon & Vanderhye P.C.

(57) ABSTRACT

An apparatus is provided to estimate a charged state of a vehicle provided with an internal combustion engine having a crankshaft, a starter that initially rotates the crankshaft when the engine is started, and a battery that powers the starter. The apparatus comprises a detection device and an acquisition device. The detection device detects a voltage of the battery and a discharge current from the battery for a period of time over time instants before and after starting the engine. The acquisition device acquires information indicative of an amount of the discharge current from the battery when the detected voltage of the battery becomes a minimum due to starting the engine.

18 Claims, 10 Drawing Sheets

APPARATUS FOR ESTIMATING CHARGED STATE OF ON-VEHICLE BATTERY

CROSS REFERENCES TO RELATED APPLICATION

The present application relates to and incorporates by reference Japanese Patent Application No. 2007-288283 filed on Nov. 6, 2007.

BACKGROUND OF THE INVENTION

1. Technical Field

The present invention relates to an apparatus for estimating the charged state of a battery mounted on a vehicle, and in particular, to such an estimating apparatus in which the battery powers not only starting means that gives initial rotation to the output shaft of an internal combustion engine mounted on the vehicle but also control means for idle stop and automatic start of the engine.

2. Related Art

Recent vehicles are often provided with an apparatus for estimating charged state of an on-vehicle battery. This kind of apparatus is exemplified by Japanese Patent Laid-open Publication No. 2006-258070. This publication discloses an apparatus, in which the charged state of an on-vehicle battery is estimated when the vehicle is stopped, and it is determined whether or not the battery is able to output a necessary power when the engine (internal combustion engine) is started. When it is determined that the necessary power can be outputted, idle stop control is allowed to automatically stop the engine. Hence, depending on whether or not restarting the engine is possible, the idle stop control can be allowed or prohibited.

It is usual that the on-vehicle battery also functions as power supply means for the engine. The battery needs to have a minimum voltage which is necessary for securing the reliability of operations of a controller mounted on the vehicle. Even though it is possible to power a starter that gives initial rotation to the output shaft of the engine in restarting the engine, a large drop in the battery voltage may occur in restarting the engine. In this case, an excessive drop in the battery voltage may lead to degraded reliability of operations of the controller. Therefore, when the vehicle is equipped with an automatic stop/start apparatus, it is desired that the minimum battery voltage in starting the engine be estimated for securing reliability of operations of the controller.

The minimum value of the battery voltage generated when the engine is started can be estimated on a formula of "$\Delta Imax \cdot R + V$", wherein R denotes the current internal resistance, $\Delta Imax$ denotes the maximum discharge current amount of a battery in starting the engine, and V denotes the current voltage of the battery.

The maximum discharge current amount is an amount of discharged current which flows through a starter so as to sharply rise immediately after powering the starter. Then this discharged current reduces rapidly as the starter starts its rotation. The maximum discharge current amount $\Delta Imax$ changes depending on various factors including the battery temperature and/or the discharge capacity of the battery. Accordingly, giving a fixed value to this maximum discharge current amount $\Delta Imax$ will invite deterioration in the estimation accuracy.

Further, it is also difficult to accurately detect the maximum discharge current amount $\Delta Imax$ by a sensor. That is, the maximum discharge current amount $\Delta Imax$ will have a very large value which is hardly caused in cases other than starting the engine. A current sensor which is also able to detect the discharge current is very high in parts cost. In this regard, it is not desired to install such a high-cost current sensor for measurement in only starting the engine.

SUMMARY OF THE INVENTION

The present invention has been made in consideration of the foregoing conventional technique, and an object of the present invention is to provide estimate a maximum amount of current discharged from an on-vehicle battery which should also power a starter starting an on-vehicle internal combustion engine.

In order to achieve the above object, the present invention provides as one aspect thereof an apparatus for estimating a charged state of a vehicle provided with an internal combustion engine having a crankshaft, a starter that initially rotates the crankshaft when the engine is started, and a battery that powers the starter, comprising detection means for detecting a voltage of the battery and a discharge current from the battery for a period of time over time instants before and after starting the engine; acquisition means for acquiring information indicative of an amount of the discharge current from the battery when the detected voltage of the battery becomes a minimum due to starting the engine.

It is preferred that the acquisition means comprises discharge current estimating means for estimating a difference between the amount of the discharge current before starting the engine and the amount of the discharge current when the detected voltage becomes the minimum due to starting the engine, based on the detected voltage and current, the difference being estimated as a maximum discharge current amount of the battery necessary for starting the engine.

BRIEF DESCRIPTION OF THE DRAWINGS

In the accompanying drawings.

DETAILED DESCRIPTION OF PREFERRED EMBODIMENTS

First Embodiment

Hereinafter referring to FIGS. 1-6, a first embodiment of the present invention will now be descried, in which the present invention is no applied to a battery state estimator mounted on a vehicle with a petrol internal combustion engine (simply engine) serving as a power generator.

Figure 1:
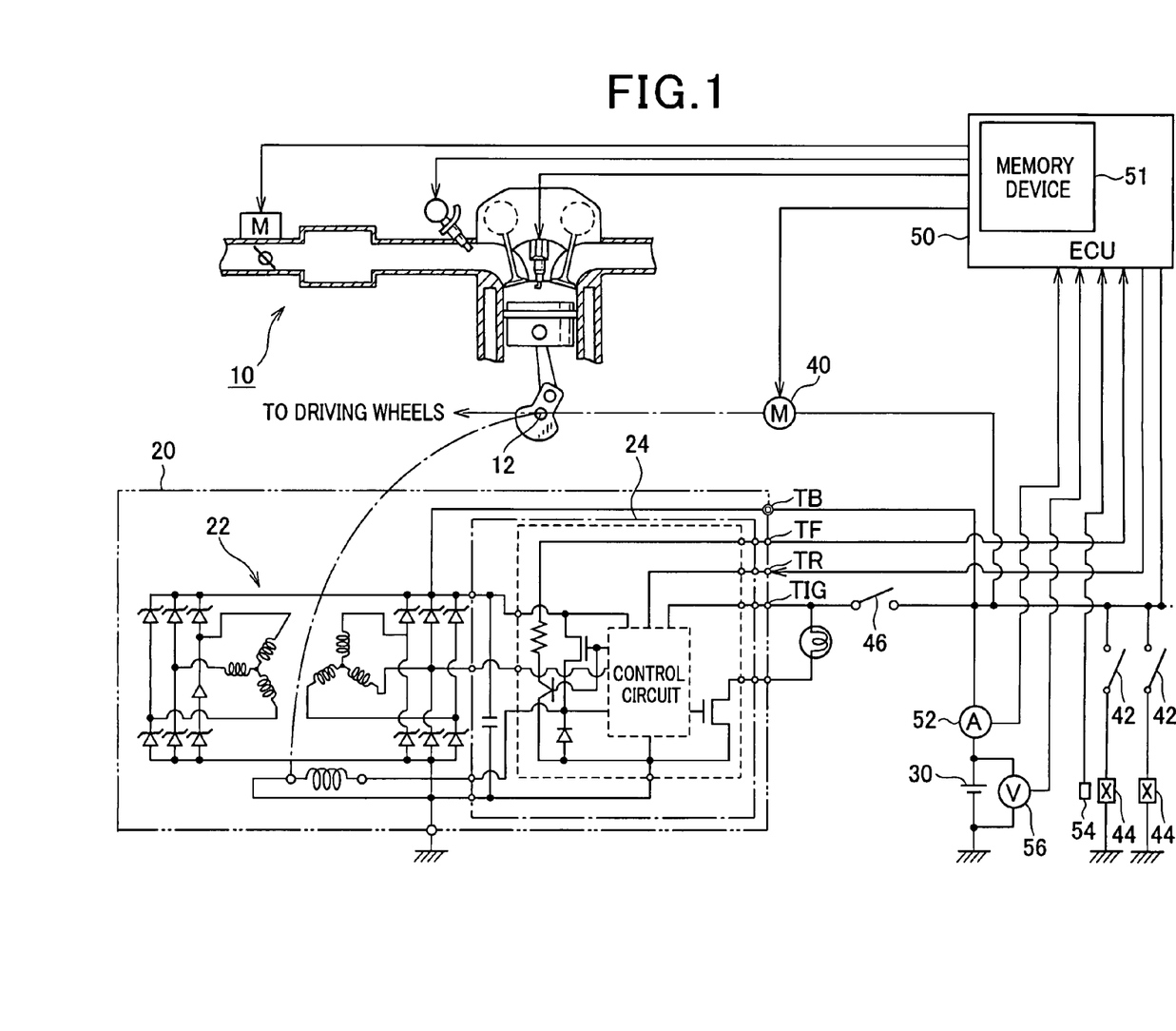
FIG. 1 is a block diagram showing the configuration of a battery state estimator according to a first embodiment of the present invention.

FIG. 1 shows the entire configuration of the battery state estimation according to the present embodiment.

The engine 10 is provided as a port-injection gasoline engine, which serves as a power generator for a vehicle. The engine 10 has an output shaft (i.e., crankshaft 12) mechanically engaged with the driving wheels of the vehicle. There is a power generating device 20 provided with an alternator 22 which is an AC generator and a regulator 24 serving as a control circuit controlling the output of the alternator 22. The rotor of the alternator 22 is mechanically linked with the crankshaft 12 of the engine 10, and thus is rotated by the rotation of the crankshaft.

The power generating device 20 has a battery terminal TB, to which a battery 30 is electrically connected which is a lead-acid storage battery. In parallel with this, an electric load 44 is electrically connected to the battery 30 via a switch 42. In addition, a starter 40 to give initial rotation to the crankshaft 12 is electrically connected as a kind of electric load to the battery 30. A power supply line, which electrically connects the battery terminal TB and the battery 30, and an ignition terminal TIG of the power generating device 20 are electrically connected to each other via an ignition switch 46.

There is also provided an ECU (electronic control unit) 50, which is one of the electric loads to the battery 30. This ECU 50 contains, as part of its essential components, a microcomputer and memory devices such as a non-volatile memory device 51. This device 51 is a memory device which is always able to hold pieces of information, regardless of the states of an activating switch for the engine. Such a switch is an ignition switch 46, which is also for a main power switch for the ECU 50. The memory device 51 is for example a backup RAM to which power supply is always kept regardless of the states of the activation switch and nonvolatile memories such as EEPROMs which always hold memories regardless of the ON/OFF states of power supply.

The ECU 50 controls the engine 10 and the power generating device 20. Based on values detected by a current sensor 52, which detects current discharging from the battery 30 and charging the battery 30, by a temperature sensor 54, which detects the temperature of the battery 30, and by a voltage sensor 56, which detects the voltage of the battery 30, the ECU 50 is configured to control voltage applied to the battery terminal TB of the power generating device 20 (this applied voltage corresponds to the output voltage of the power generating device 20). This control is made such that the ECU 50 outputs a command value (command voltage) for the output voltage to a commanding terminal TR given to the power generating device 20. In response to this, the regulator 24 is allowed to control its output voltage to the command voltage. Further, the power generating device 20 has a monitor terminal TF, so that the ECU 50 uses this monitor terminal TF to receive a generating-state signal indicative of the generation capacity of the power generating device 20. The generation capacity is quantified as an ON/OFF temporal rate (known as a duty or duty ratio) given to switching elements incorporated in the regulator 24.

The output voltage is controlled to reduce, as much as possible, the amount of increase in the fuel consumed by the engine 10 (which is due to the generation by the power generating device 20), during control of the charged state (known as a SOC (State Of Charge) of the battery 30. The SOC is a physical quantity which quantifies the discharge capacity of the battery 30, and specifically, this physical quantity shows the rate of a currently charged amount to the full charged amount of the battery 30. The SOC is usually quantified as "5-hour-rate capacity" or "10-hour-rate capacity," for example. It is known that the battery 30 has an open-end voltage, which is a voltage given when both terminals thereof are open, which depends on its SOC. Practically, the open-end voltage is higher with an increase in the SOC. For example, when the SOC is "100%," the open-end voltage is "12.8 V," and, when the SOC is "0%," the open-end voltage is "11.8 V."

In addition to the above, the ECU 50 is in charge of performing idle stop control (i.e., automatic stop process) and automatic start processes. The idle stop control is to automatically stop the engine 10 by stopping idle rotation speed control for the engine 10 during a stop of the vehicle. The automatic start process is a process to automatically start the engine 10 from its idle stop controlled state. This automatic start process is carried out by activating the starter 40 to provide initial rotation to the crankshaft 12 of the engine 10, and controlling the combustion in the engine 10.

It is known that, when activating the starter 40, a large amount of discharge current flows from the battery 30 to the starter 40 for a short period of time from the start of activation of the starter to the start of its rotation. Such a large amount of discharge current will cause a large drop in the voltage of the battery 30. Since the ECU 50 operates on power supply from the battery 30, there is a minimum voltage which is required for the ECU 38. This minimum voltage is set to a value to maintain reliability of operations of the ECU 50. Hence, in cases where the voltage of the battery 30 drops largely due to the automatic start process for the engine 10, the reliability of operations of the engine 10 may decrease. Hence, the idle stop control should be performed under the condition that a decrease in the voltage of the battery 30, which is due to the automatic start process, is always above a minimum operational voltage needed by the ECU 40.

Consideration is made such that a minimum value of the voltage of the battery 30, which is caused by the automatic start process, is caused at a timing when the amount of discharge current from the battery 30 becomes a maximum. In the present embodiment, for starting the engine 10 by operating the ignition switch 46, information indicative of the maximum discharge current amount is acquired as learning values, which are used to estimate an amount of decrease in the voltage of the battery 30 in real time, which decrease is due to the automatic start process.

Hereinafter, how to learn the information indicative of the maximum discharge current amount will now be described.

Figure 2A:
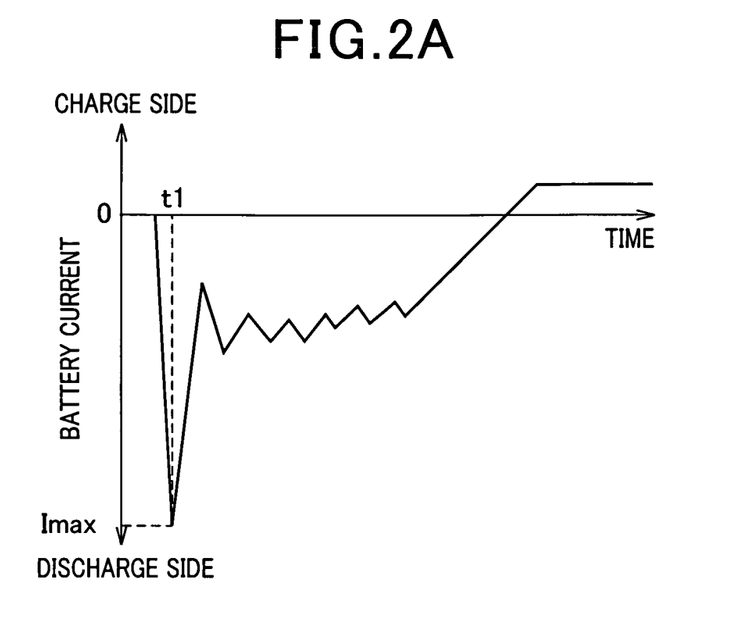
FIGS. 2A and 2B are graphs each showing a transition of a battery discharge current generated when starting an on-vehicle engine.

FIG. 2A shows behaviors of current to or from the battery 30, which is caused in response to activating the starter 40. An electric connection between the starter 40 and the battery 30 will cause a rapid rise in the discharge current from the battery 30, and reaches a maximum current Imax at a time instant t1. This maximum value Imax is defined by various factors such as the resistance of the starter 40, the internal resistance of the battery 30, and the resistance of wiring between the starter 40 and the battery 30. After the starter 40 starts its rotation, the current flowing to the starter 40 gradually decreases. In other words, the discharge current from the battery 30 will gradually decrease. In the present embodiment, the current sensor 52 has a predetermined current detection range which is set below the maximum current Imax of the discharge current, so that the current sensor 52 cannot detect the maximum current Imax. Instead, the present embodiment adopts the technique of estimating the maximum discharge current amount from the battery 30 when the engine is started by operating the ignition switch 46.

Figure 2B:
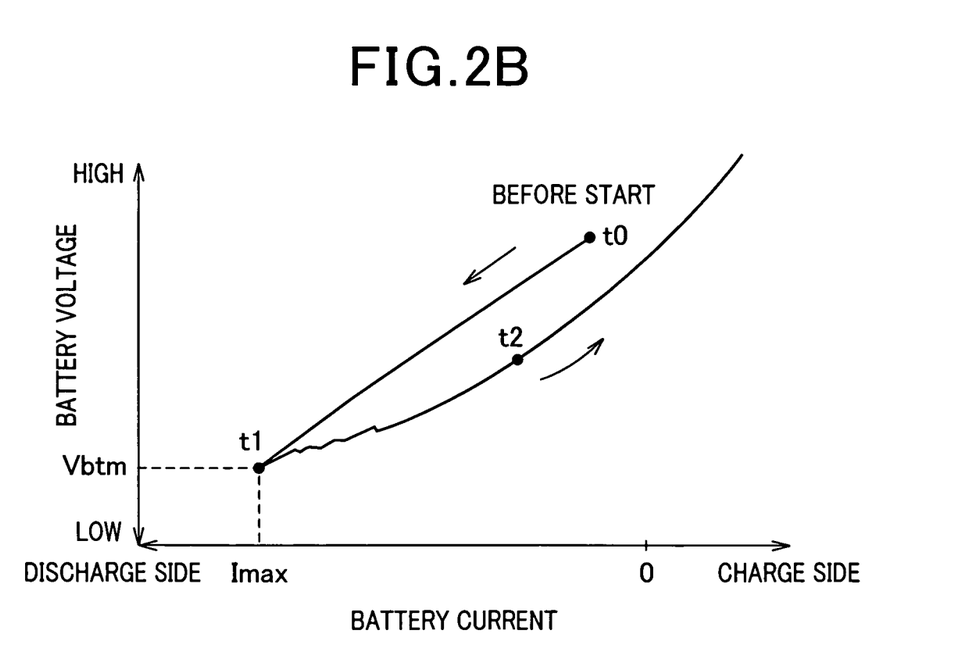

FIG. 2B shows changes in the current and voltage of the battery 30, which can be seen in starting the starter 40. As shown therein, at a time instant to, the discharge current from the battery 30 starts to increase in response to activating the starter 40. At a time instant t1, the discharge current reaches its maximum Imax and the voltage of the battery 30 reaches its minimum voltage Vbtm. In this state, because the influence of polarization in the battery 30 is very small, the internal resistance of the battery 30 which is estimated from changes in the battery voltage in relation to changes in the battery current can be regarded as a value close to a true internal resistance. However, because this period of time in which the maximum current Imax appears is short, it is difficult to calculate the internal resistance based on voltages and currents sampled during this period of time.

After the discharge current has reached its peak (i.e., the maximum value Imax) at the time instant t1, the voltage of the battery 30 decreases with a decrease in the discharge current. After reaching the maximum value Imax, the decrease in the discharge current lasts over a comparatively longer period, during which the current sensor 52 can sample the discharge current at a number of temporal points after the discharge current decreases down to a certain moderate level. Thus, in this period, it is comparatively easier to calculate the internal resistance of the battery 30. It is generally considered that the internal resistances obtained in both periods of time before and after the maximum value Imax of the discharge current differ from each other. Accordingly, employing the internal resistance to be calculated on current values detected after the Imax makes it difficult to accurately estimate the maximum value Imax based on the minimum voltage Vbtm of the battery 30.

Figure 3:
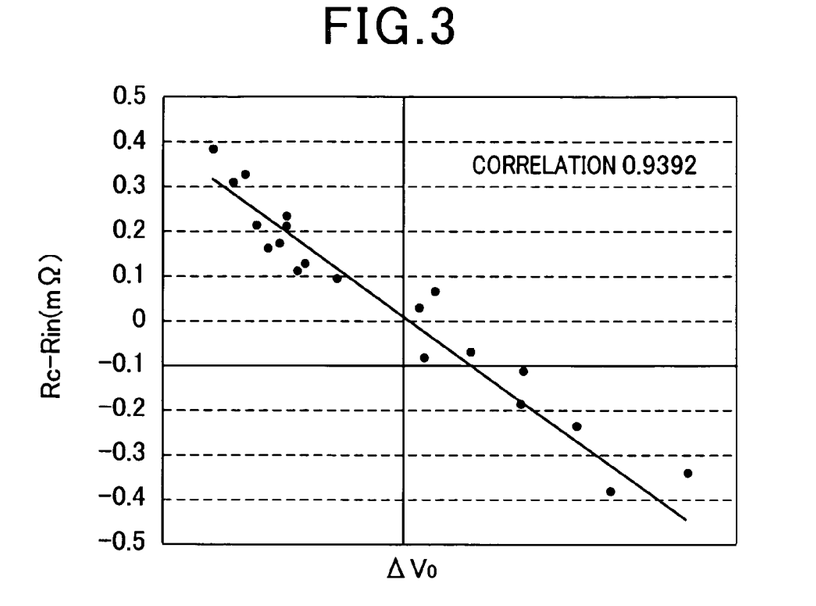
FIG. 3 is a graph explaining how to estimate the internal resistance of a battery mounted on a vehicle, which internal resistance is obtained when a maximum discharge current is caused.

The present embodiment takes this condition into account, where attention is focused to the known fact that a difference of the internal resistance Rc given after reaching the maximum value Imax and the internal resistance Rin given before reaching that value Imax correlates with a difference between the open-end voltages provided before and after activating the starter 40. FIG. 3 shows measurement data presenting this evidence. In FIG. 3, the longitudinal axis represents a difference between the internal resistance Rc given when the discharge current rapidly increases (i.e., the internal resistance provided before reaching the maximum value Imax) and the internal resistance Rc given during a cranking operation (i.e, the internal resistance after reaching the maximum value Imax). The lateral axis in FIG. 3 represents a difference $\Delta Vo$ between the open-end voltages given before and after activating the starter. As shown, the greater the difference $\Delta Vo$, the smaller the difference of the internal resistance Rc so to the internal resistance Rin, which is a proportional relationship. The difference $\Delta Vo$ and the internal resistance Rc both can be used to estimate the internal resistance Rin given when the discharge current rapidly increases.

Figure 4:
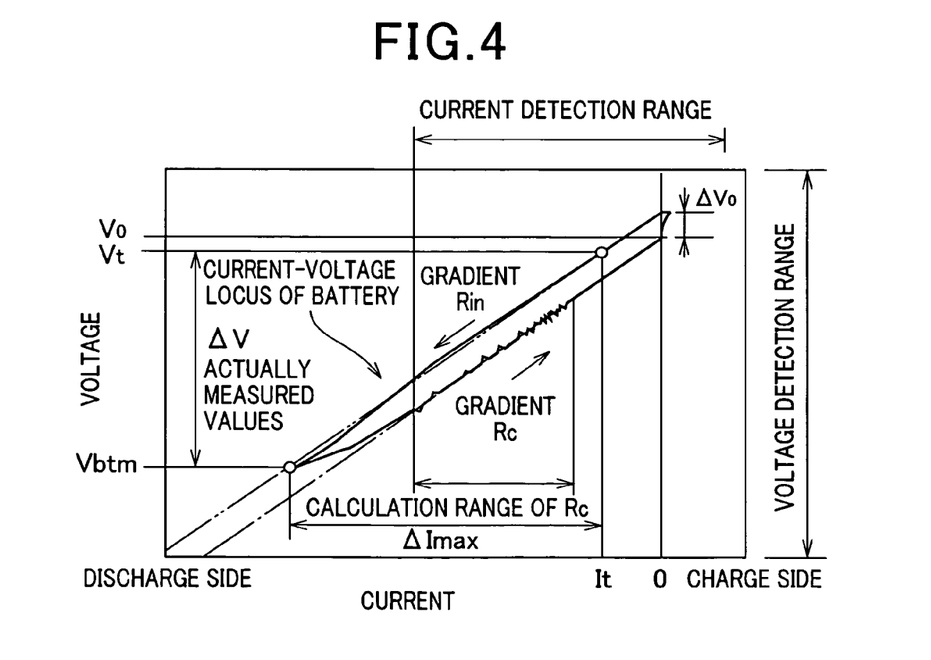
FIG. 4 is an illustration showing the principle of estimation for the maximum discharge current.

Specifically, using a locus of the voltage of the battery 30 which is shown by a solid line in FIG. 4, the voltage Vt of the battery 30 generated before activating the starter 40 and the minimum voltage Vbtm of the battery 30 generated in response to activating the starter 40 can be detected. Hence an amount of drop in the voltage of the battery 30, which responds to activating the starter 40, is calculated. On the other hand, the behaviors of current and voltage appearing after the maximum value of the discharge current can be used to calculate the internal resistance Rc shown by a dashed line in FIG. 4. This internal resistance Rc can be combined with the open-end voltage difference $\Delta Vo$ in order to estimate the internal resistance Rin provided during the rapid rise in the discharge current, which is shown by a chain double-dashed line in FIG. 4. Then, using the internal resistance Rin and the voltage drop $\Delta V$, it is possible to estimate the maximum discharge current amount $\Delta Vo$ of the battery 30, which will be caused by activating the starter 40.

Figure 5:
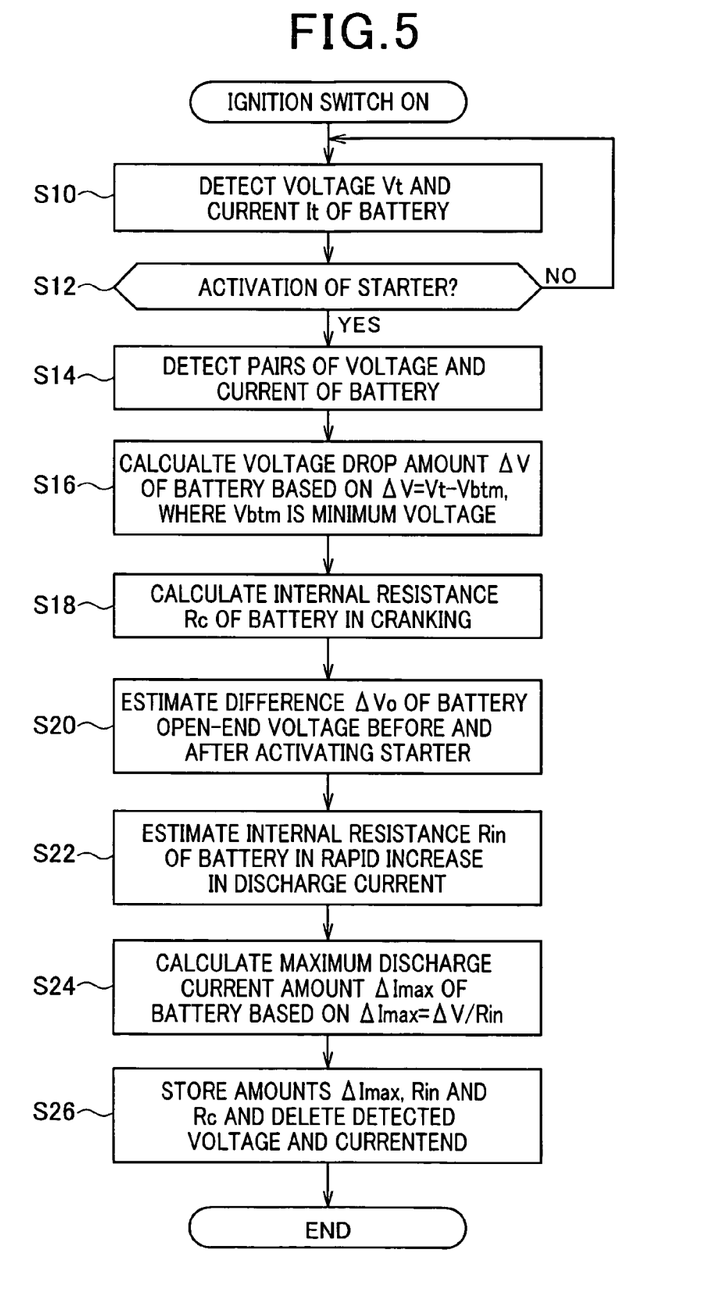
FIG. 5 is a flowchart showing the procedure necessary for estimating the maximum discharge current in the first embodiment.

Referring to FIG. 5, the process for estimating the maximum discharge current amount $\Delta Imax$ will now be described. This process is executed by the ECU 50 in response to, as a trigger, the ON-operation of the ignition switch 46.

At the first step S10, a voltage value Vt of a current value It of the battery 30 are detected on the signals detected by the voltage sensor 56 and the current sensor 52. This step S10 is repeatedly executed until it is determined at step S12 the starter 40 has been activated. A plurality of voltage and current values Vt and It can be acquired, respectively, during a certain period of time (for example, one second to a few seconds). Hence, the plural values of each of the voltage and current can be averaged over the acquisition time.

If the determination at step S12 reveals that the starter 40 has been activated, the process proceeds to step S14, where the current and voltage of the battery 30, which occur in response to activating the starter 40, are detected simultaneously a plurality of times, pair by pair. The process then proceeds to step S16, where the minimum voltage Vbtm of the battery 30 acquired at step S14 is subtracted from the voltage Vt acquired at step S10, whereby the voltage drop amount $\Delta V$ of the battery 30 can be calculated.

The process proceeds to the next step S18, where the internal resistance Rc of the battery is calculated, which is generated during the cranking operation. In the present embodiment, a plural of pairs of voltage values and current values, which current and voltage were acquired simultaneously pair by pair, are used for calculating the internal resistance Rc. These pairs of data are detected during a period of time (refer to a period of time from the time instant t1 to a time instant t2) coming after the discharge current becomes beyond the lower limit of the detectable range thereof. This detection is performed by detecting the battery current increasing beyond the lower limit after having reduced temporarily. The plurality of pairs of data can be used to estimate the internal resistance Rc using known analysis techniques such as a regression analysis technique. That is, a linear-expression model with both current employed as an explanatory variable and objective variable employed as an objective variable is calculated on a least-squire method, in which the internal resistance Rc is set to the coefficient of this linear-expression model. The plurality of pairs of data may be all of the pairs of detected data or a predetermined number of pairs of data selected from the plurality of pairs of detected data.

At step S20, a difference $\Delta Vo$ between the open-end voltage (open circuit voltage) values of the battery 30 which are generated before and after activating the starter 40 is calculated. The open-end voltage Voaf generated after activating the starter 40 can be an intercept of the liner-expression model figured out on the regression analysis. In contrast, the open-end voltage Vobe generated before activating the starter 40 can be estimated on an easy-to-use formula of "Vobe=Vt− Rc·It" by using the foregoing current It and the voltage Vt in a state where an assumption is made such that the internal resistance will not change during the rapid increase in the discharge current before activating the starter 40 and this non-changed internal resistance can be approximated as the internal resistance Rc. Hence the difference ΔVo between the open-end voltage values can be calculated from "Vobe−Voaf."

At the next step S22, the internal resistance Rin generated during the rapid rise in the discharge current is estimated. Practically, based on the correlation relationship shown in FIG. 3, the internal resistance Rc calculated at step S18 is corrected using the difference ΔVo calculated at step S20, so that the internal resistance Rin is estimated. At step S24, the voltage drop amount ΔV calculated at step S16 is divided by the internal resistance Rin estimated at step S22, with the result that the maximum discharge current amount ΔImax of the battery 30, which is due to starting the starter 40 is calculated. Then at step S26, both the maximum discharge current amount ΔImax and the internal resistance Rin are stored in a memory of the ECU 50 and temporarily stored data showing the internal resistance Rc and the detected values of the voltage and current are deleted from the memory. After the step S26, the present process ends and waits until the ignition switch is turned on next.

Figure 6:
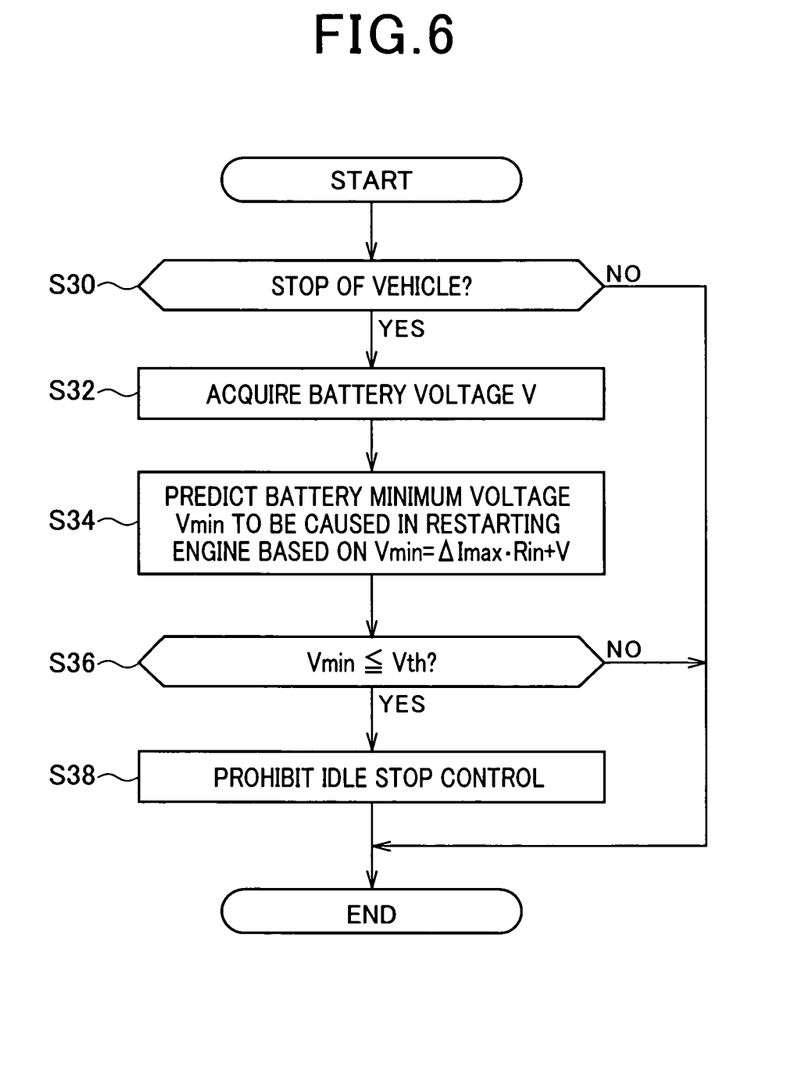
FIG. 6 is a flowchart showing the procedure necessary for prohibiting automatic stop and start of the engine in the first embodiment.

Referring to FIG. 6, a process for prohibiting idle stop control will now be described, which is executed on the maximum discharge current amount ΔImax. This process is repeated by the ECU 50 at given intervals.

When the process shown in FIG. 6 starts, step S30 is first initiated, where the ECU 50 determines whether or not the vehicle is in stop. This step is intended to determine whether or not the idle stop so control is executable. When it is determined that the vehicle is in stop, step S32 is then executed where the voltage of the battery 30 is detected. It is desired that the voltage to be detected expresses the present voltage of the battery 30. Hence, in this regard, it is thus desired to employ the newest voltage among the voltages detected. However, an alternative, which is more compromised, is to employ a voltage detected within a given period of time immediately before the present time instant.

At step S34, a minimum voltage Vmin is estimated, which will be caused due to a drop in the voltage of the battery 30 if assumption is made such that the engine is re-started now. Practically, on the basis of the maximum discharge current amount ΔImax and the internal resistance Rin stored at step S26 in FIG. 5, the minimum voltage Vmin is estimated by calculating using the formula of "Vmin=ΔImax·Rin+V," where a factor of the maximum voltage drop amount is considered. At step S36, it is determined whether or not the minimum voltage Vmin is equal to or less than a threshold Vth. This step is intended to determine whether or not the current charged state of the battery 30 can enable the restart process for restarting the engine 10. The threshold Vth is set to a limit higher than voltage values which will probably reduce reliability in operating the ECU 50.

If it is determined that the minimum voltage Vmin is equal to or less than the threshold Vth, step S38 is executed where the idle stop control is prohibited using, for example, a flag showing the prohibition. In other words, immediately after the stop of the vehicle, the transition to the idle stop control is not allowed. Moreover, if the determination at step S36 shows the affirmative reply on account of reasons such as a drop of the battery voltage though the idle stop has been allowed once after the stop of the vehicle, the idle stop control is halted to restart the engine at once. In this respect, the threshold voltage Vth is desired to be higher than a minimum limit voltage which is still able to keep reliability in the operations of the ECU 50 for restarting the engine 10. Completion of step S38 or the negative determination at step S30 or S36 results in an end of this process in the current control cycle.

In this way, in consideration of the present charged state of the battery 30, the minimum voltage Vmin of the battery 30 which will be caused by starting the starter 40 is estimated. Hence, the idle stop control can be continued until the battery voltage decreases down to a lower limit which is able to guarantee the reliability of the operations executed by the ECU 50. Thus, it is possible to reduce fuel consumption in the engine 10.

Operational advantages, which can be enjoyed in the present embodiment, are as follows.

Based on the current and voltage values of the battery 30 detected during a period of time over time instants before and after starting the starter, a difference between the current It given before starting the engine 10 and the maximum current Imax which will be given when the battery voltage becomes a minimum due to the start of the engine 10 can be estimated as the maximum discharge current amount ΔImax.

The internal resistance Rin of the battery 30 appearing in a period of time ranging to a time instant at which the battery voltage becomes a minimum due to starting the starter 40 (i.e., the engine 10) is estimated. This internal resistance Rin is given in a rapid increase in the discharge current, accordingly. Further, depending on this estimated internal resistance Rin, the maximum discharge current amount ΔImax is estimated. The internal resistance Rin defines the relationship between i) a difference between the battery voltage given before starting the starter 40 and the battery minimum voltage given when starting the starter 40 and ii) the maximum discharge current amount. Because of this, using the internal resistance Rin makes it possible to properly estimate the maximum discharge current amount ΔImax.

Furthermore, using i) a difference ΔVO between the battery so open-end voltage values given before and after starting the starter 40 and ii) the internal resistance Rc, the battery internal resistance Rin given during a period of time in which the battery voltage decreases down to a minimum is estimated with high accuracy. This internal resistance Rin is given during a rapid increase in the discharge current, accordingly.

Based on the maximum discharge current amount ΔImax and the battery voltage V, a minimum battery voltage Vmin, which will be caused on the assumption that the engine is now restarted by starting the starter 40, is predicted.

The predicted minimum battery voltage Vmin is used to decide whether the idle stop control for the engine 10 should be prohibited or not. It is therefore possible to perform the automatic stop process and the automatic start process on the basis of real-time proper judgments as to whether or not reliability in the operations of the ECU 50 reduces due to a large drop in the battery voltage.

Second Embodiment

Figure 7:
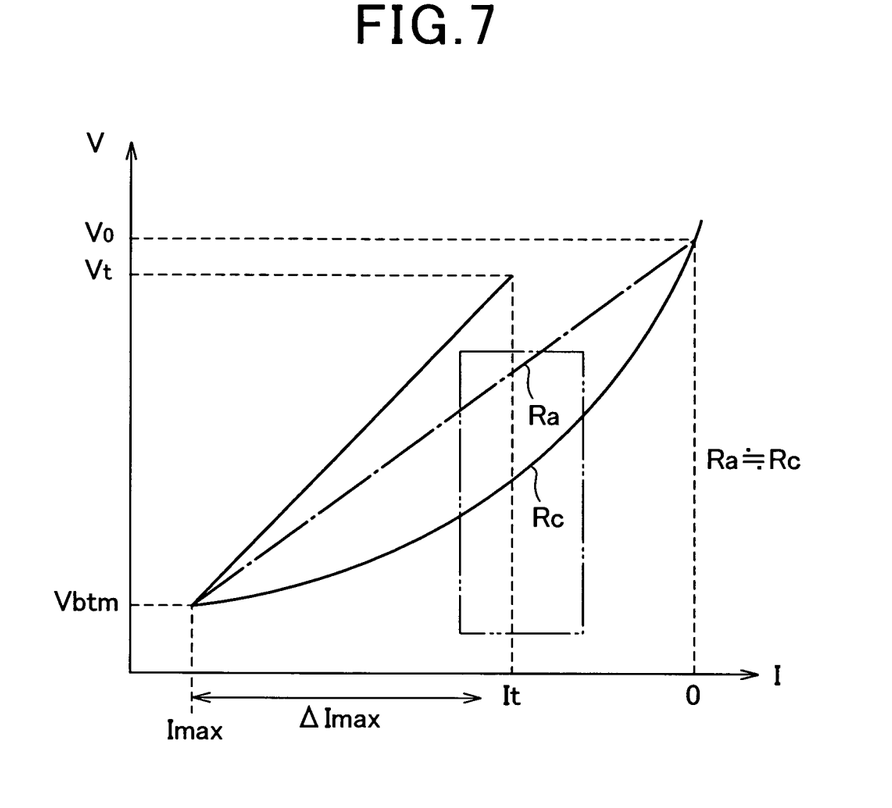
FIG. 7 is a graph showing how to estimate the maximum discharge current in a battery state estimator according to a second embodiment of the present invention.
Figure 8:
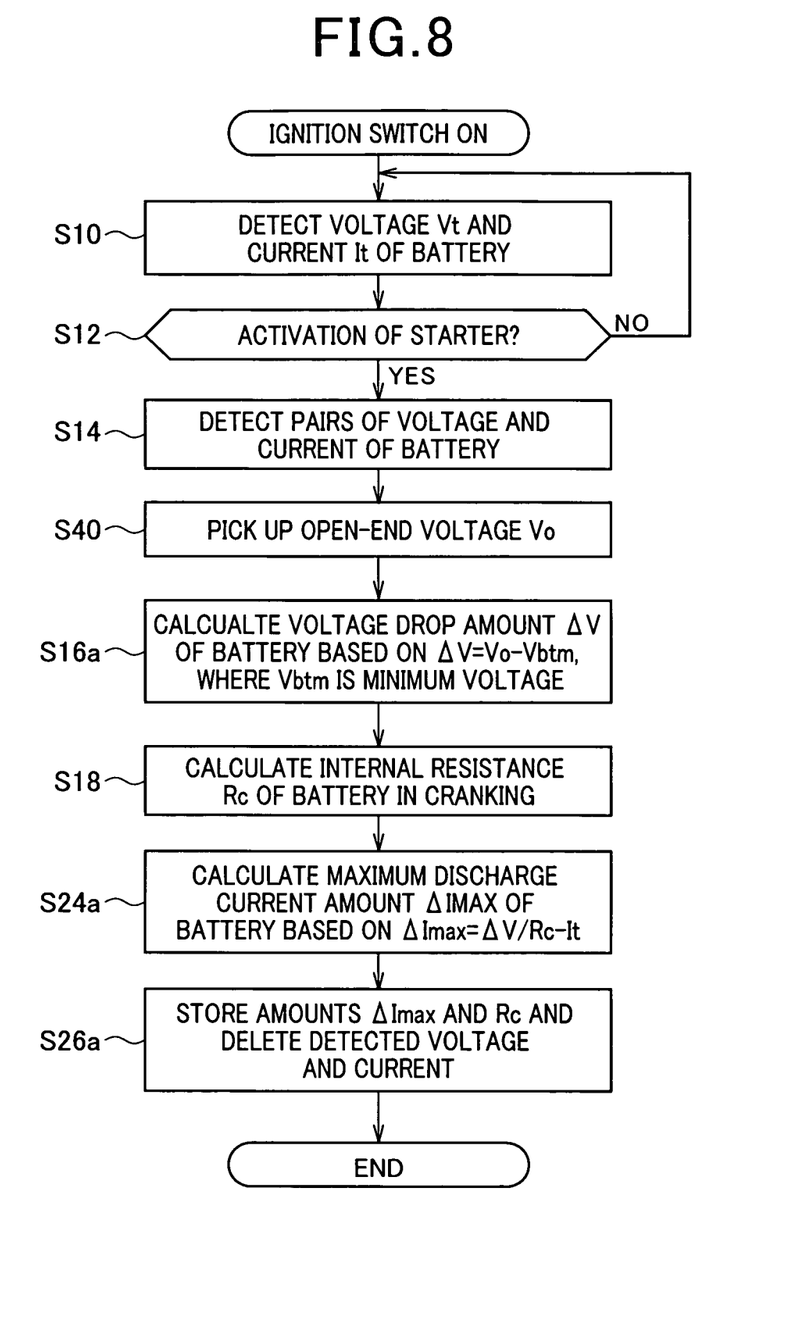
FIG. 8 is a flowchart showing the procedure necessary for the maximum discharge current in the second embodiment.

Referring to FIGS. 6-8, a second embodiment of the present invention will now be described, where only different components from those in the first embodiment are mainly focused. In the second embodiment and subsequent embodiments, similar or identical components to those explained in the first embodiment will given the same references as those in the first embodiment, for the sake of simplified explanation.

FIG. 7 shows how to estimate the maximum discharge current amount ΔImax according to the present embodiment. As shown, the discharge current from the battery 30 reaches a maximum value Imax, and then decreases gradually and becomes zero finally. A line connecting a time instant at which the discharge current becomes maximum (Imax, Vbtm) and a time instant at which the discharge current is zero (0, Vo) provides a gradient Ra. If this gradient Ra is known, it is possible to estimate the maximum discharge current amount ΔImax based on the minimum voltage Vbtm and the open-end voltage Vo. In FIG. 7, a gradient of a line which approximates changes in the voltage to changes in the current in a region enclosed by a chain double-dashed line (i.e., an internal resistance Rc) is close to the gradient Ra. That is, it is possible that some specifications of the starter 40, engine 10, and current sensor 52 allows the Internal resistance Rc, which is calculated on sampled current and voltage values in a specific region within the detectable range of the current sensor 52, to be approximated to the gradient Ra. Hence, in this case, the specific range (the region enclosed by the chain double-dashed line in FIG. 7 is adapted properly, so that the maximum discharge current amount ΔImax can be calculated easily.

FIG. 8 shows a process for estimating the maximum discharge current amount ΔImax in the present embodiment. This process is started by the ECU 50 in response to an on-operation to the ignition switch 46, which serves as a trigger to this process. Incidentally, in FIG. 8, the steps given the same reference numbers as those in FIG. 5 provide the same contents as those in FIG. 5.

In the process shown in FIG. 8, completing step S14 allows the processing to proceed to step S40. At this step S40, an open-end voltage Vo, which is a voltage value given at a time instant when the battery charge/discharge current becomes zero, is picked up. The process then proceeds to step S16a, where an amount of drop in the voltage of the battery 30 (a voltage drop amount ΔV) is calculated, which serves as a difference between the foregoing open-end voltage Vo and the minimum voltage Vbtm.

At step S18, the internal resistance Rc of the battery 30 is then calculated. At step S24a, the voltage drop amount ΔV, the internal resistance Rc, and the current It given before starting the starter 40, which is acquired at step S10, are used to calculate a maximum discharge current amount ΔImax. Namely, a ratio of the voltage drop amount ΔV to the internal resistance Rc directly corresponds to a maximum value Imax of the discharge current, which corresponds to a value calculated by adding the current It given before starting the starter 40, to the discharge current amount due to activating the starter 40. Hence, the maximum discharge current amount ΔImax due to activating the starter 40 can be calculated from a formula of "ΔV/Rc–It." Further, at step S26a, data of the maximum discharge current amount ΔImax is stored in a memory of the ECU 50, while data of the internal resistance Rc and the detected values of the voltage and current are deleted from the memory. When completing step S26a, the process of FIG. 8 is ended until the next on-operation to the ignition switch.

It is therefore possible to calculate the maximum discharge current amount ΔImax in an easier manner. Incidentally, for estimating the minimum voltage Vmin on the process shown in FIG. 6, the internal resistance Rin is used in the present embodiment. This internal resistance Rin can be set in advance depending on the SOC, for example.

Hence, in the second embodiment, there is provided an operational advantage, in addition to those gained in the first embodiment.

That is, the maximum discharge current amount ΔImax can be estimated in an easier manner, because the internal resistance Rc can be calculated using detected values of the current and voltage detected in a specific period which provides an assumption that the internal resistance Rc approximates the gradient Ra of the line shown in FIG. 7.

Third Embodiment

Referring to FIGS. 9A and 9B-10, a third embodiment of the present invention will now be described, where only different components from those in the first embodiment are mainly focused.

Figure 9A:
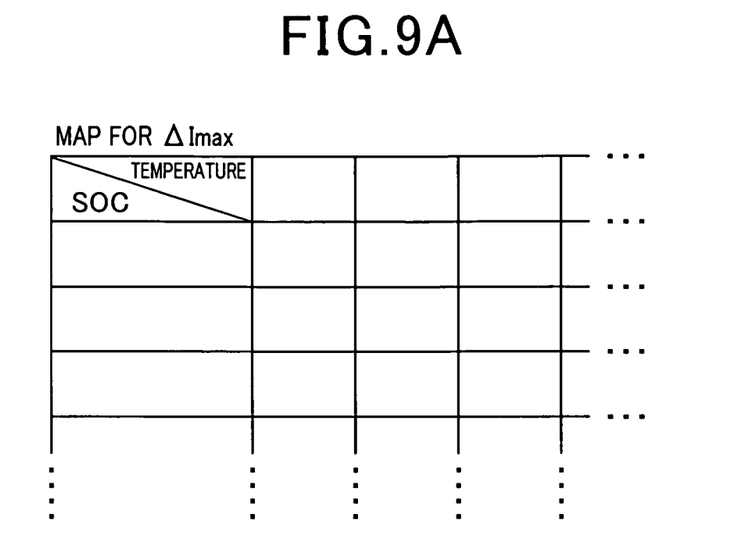
FIGS. 9A and 9B explain maps produced in a memory, which maps are for the maximum discharge current and an internal resistance used by a battery state estimator according to a third embodiment of the present invention.
Figure 9B:
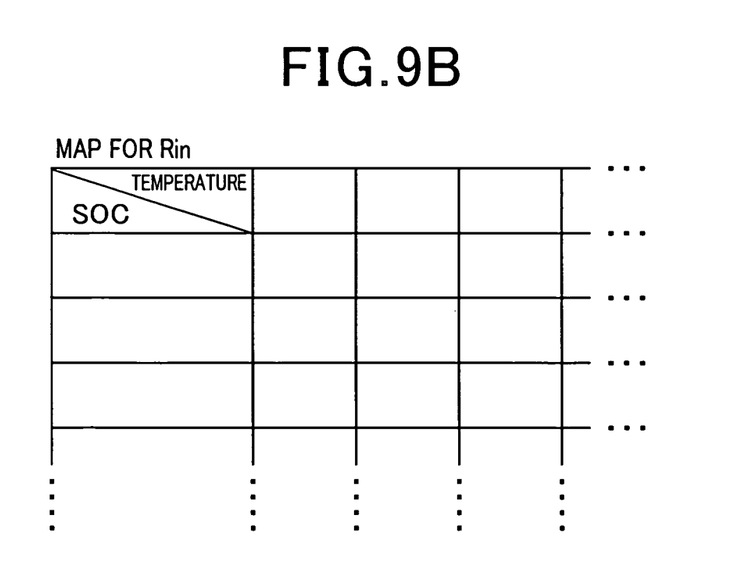

In the present embodiment, data indicting the maximum discharge current amount ΔImax and the internal resistance Rin calculated through the process in FIG. 5 are stored in the memory device 51. This storage is illustrated as maps in FIGS. 9A and 9B, where each of the maximum discharge current amount ΔImax and the internal resistance Rin is given depending on a plurality of battery temperature ranges and a plurality of SOC ranges. The map in FIG. 9A shows the storage of the maximum discharge current amount ΔImax, while FIG. 9B shows the storage of the internal resistance Rin. Hence, depending on changes in the battery temperature and the SOC, those physical quantities ΔImax and kin can be selected in a more accurate manner.

Figure 10:
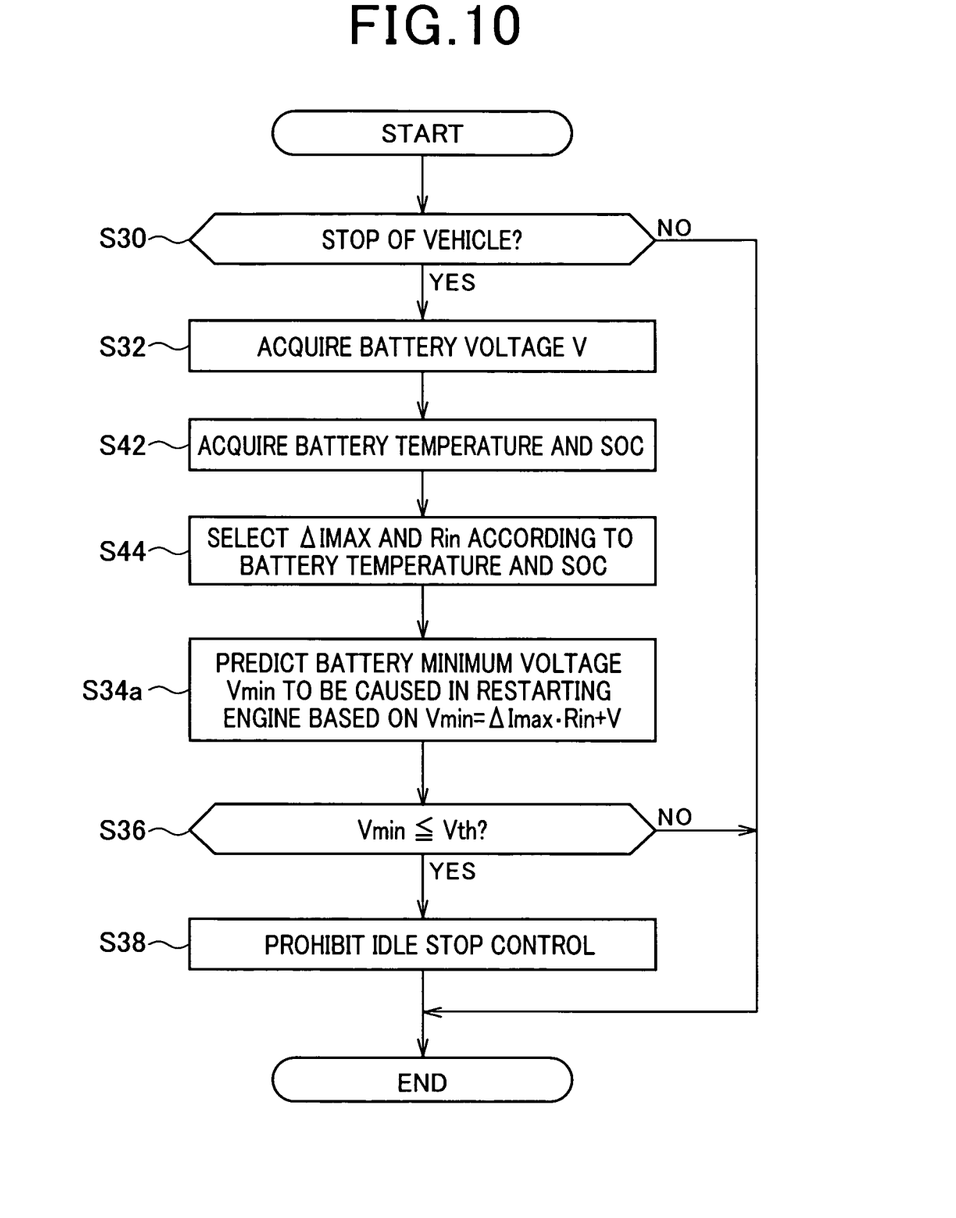
FIG. 10 is a flowchart showing the procedure necessary for prohibiting automatic stop and start of the engine in the third embodiment.

FIG. 10 shows a process for prohibiting the idle stop control based on the maximum discharge current amount ΔImax obtained as above. The ECU 50 repeats this process at Intervals. In FIG. 10, the steps which are the same as those in FIG. 6 are given the same reference numerals.

In this process, when completing step S32, step S42 is processed, where data indicative of the temperature of the battery 30 and the SOC are acquired. It is naturally desired that the data of the battery temperature and the SOC be the newest to show the current charged state of the battery 30. However, there may be employed an approximation technique that those values are detected or calculated using data acquired during a predetermined period of time immediately before the present time.

At step S44, in accordance with the battery temperature and the SOC acquired at step S42, ranges are specified in each of the maps shown in FIGS. 9A and 9B, so that a maximum discharge current amount ΔImax and a internal resistance Rin can be selected depending on the acquired values at step S42. At step S34a, the selected maximum discharge current amount ΔImax and the internal resistance Rin are then used to estimate the minimum voltage Vmin.

Therefore, in addition to the operational advantages gained in the first embodiment, an additional advantage can be provided as follows.

That is, the maximum discharge current amount ΔImax and the internal resistance Rin are not fixed, but can be varied depending on changes in both the battery temperature and the SOC. For this, the two-dimensional map on the battery temperature and the SOC is prepared in advance for each of the quantity ΔImax and Rin, as shown in FIGS. 9A and 9S. Hence, using more accurately designated quantities ΔImax and Rin, the minimum voltage Vmin can be estimated. This allows the voltage drop amount of the batter 30 to be estimated in a real-time and accurate manner, resulting in estimating the battery minimum voltage Vmin with precision.

Modifications

There are provided some modifications of the foregoing embodiments as below.

A first modification relates to the sampling period during which current is sampled. In the second embodiment, in the two-dimensional coordinate system with the battery current and voltage, a specific period of time, which can provide an assumption that the internal resistance Rc approximates the gradient of the line connecting the minimum voltage Vbtm and the open-end voltage Vo, is set as the sampling period. However, this is just an example. Alternatively, the sampling period may be set to a specific period of time which can provide an assumption that internal resistance Rc approximates the gradient of a line connecting the minimum voltage Vbtm and a specified value of the battery voltage.

Figure 11:
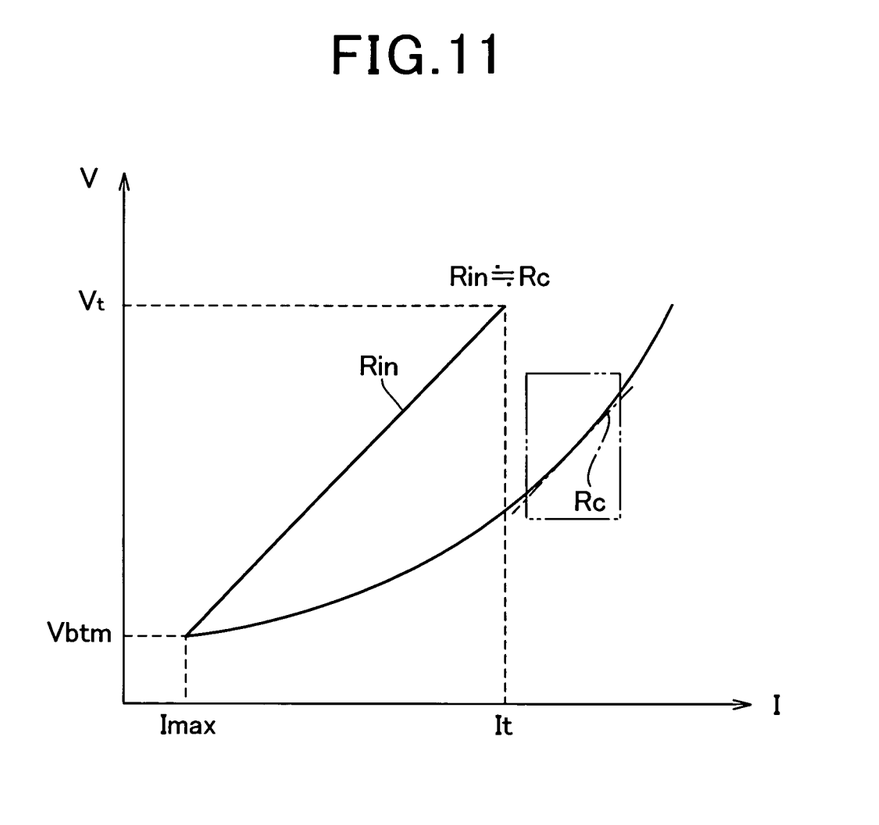
FIG. 11 is an illustration showing the principle of estimation for the maximum discharge current according to a modification of the second embodiment.

A second modification is illustrated in FIG. 11, which also relates to the sampling period of the battery current. As shown, a specific period during which the internal resistance Rc can approximate the internal resistance Rin may be employed as the sampling period. Accordingly, a formula of "(Vc−Vbtm)/Rc" can be used to estimate the maximum discharge current amount ΔImax. As a further developed example, data indicating both the internal resistance Rc used in the second modification and the maximum discharge current amount ΔImax may be memorized in a memory. In this example, based on every voltage value to be sampled in sequence, the minimum voltage Vmin can be estimated on a formula of "ΔImax·RC+V". The estimation of this minimum voltage Vmin may be carried out on the same way as that in the third embodiment.

A third modification concerns the previous storage of the data indicating both the maximum discharge current amount ΔImax and the internal resistance Rin. This storage technique is not limited to that used in the third embodiment, but may be developed such that each of the maximum discharge current amount ΔImax and the internal resistance Rin is stored in a memory depending on every divided range of only one of the battery temperature and the SOC. Alternatively, depending on every divided range of each of the battery temperature and the SOC, only one of the maximum discharge current amount ΔImax and the internal resistance Rin may be subjected to previous storing its data into a memory. Further, depending on every divided range of only one selected from the battery temperature and the SOC, only one of the maximum discharge current amount ΔImax and the internal resistance Rin may be subjected to previous storing its data into a memory.

A fourth modification concerns what physical quantity is estimated. Instead of estimating the maximum discharge current amount ΔImax, the discharge current (the maximum Imax) itself, which appears when the battery voltage becomes a minimum, may be estimated. For example, instead of step S24 in FIG. 5, calculation of "Imax=Vbtm/Rin" may be performed. Alternatively, instead of step S24a in FIG. 8, calculation on "Imax=ΔV/Rc" may be performed. In a period of time before powering the starter 40 during idle stop, it is assumed that the amount of discharge current from the battery 30 is small. Hence, instead of using the foregoing maximum discharge current amount ΔImax, the maximum current Imax may be used to be applied to the process exemplified in either in FIG. 6 or FIG. 10.

Further, in the process shown in FIG. 6, in place of the battery voltage V, it is possible to estimate a voltage value which should be present when the discharge current from the battery 30 is zero. Hence, based on this estimated voltage value, the minimum voltage Vmin caused in response to the restart during idle stop can be predicted. That is the battery discharge current I acquired before powering the starter 30 is stored in a memory, and the maximum discharge current amount ΔImax in the restart is calculated on "Imax−I+(present discharge current)", with the result that the minimum voltage Vmin may be predicted (estimated) based on the internal resistance Rin and the estimated voltage value.

A fifth modification concerns how to acquire the open-end voltage Vo before starting the starter. This acquisition method is not limited to that exemplified in the first and third embodiments. By way of example, this open-end voltage Vo before starting the starter may be estimated using regression analysis to be applied to values of battery voltage and current detected when the engine 10 is stopped.

A sixth modification concerns the automatic start process for the engine which is followed by the idle stop control. The starter 40 is not only one means for giving the initial rotation to the crankshaft 12 of the engine 10. For example, a motor generator (MG) dedicated to the automatic start may be provided separately from the starter 40. In this case, it is preferred that the maximum discharge current amount ΔImax is calculated based on values of voltage and current of the battery 30 which are detected when automatically starting the engine 10 using the motor generator.

Moreover, a seventh modification is provided, which relates to the usage of the maximum discharge current amount ΔImax. In the forgoing, the determination whether or not idle stop control should be prohibited is made based on the maximum discharge amount ΔImax, but this is not a decisive list. For example, under a condition where it is assumed that there is a possibility that the engine 10 will be stopped for idle stop, the maximum discharge amount ΔImax may be used to predict the minimum voltage Vmin in the next start. In this prediction, when the minimum voltage Vmin is equal to or less than a threshold voltage Vth, the amount of power to be generated by the alternator 22 before stopping the engine 10 is made to increase, thus accelerating charging the battery 30, thus stabilizing the voltage applied to the ECU 50 in the next start.

The foregoing embodiments employ a port-injection and spark-injection type of internal combustion engine, but the engine is not limited to this type. For example, an in-cylinder-injection and spark-injection type of internal combustion engine and a compression ignition type of internal combustion engine such as a diesel engine may be used.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An apparatus for estimating a charged state of a battery of a vehicle provided with an internal combustion engine having a crankshaft and a starter that initially rotates the crankshaft when the engine is started, the battery powering the starter, comprising:
    detection means for detecting a voltage of the battery and a discharge current from the battery for a period of time ranging time instants before and after starting the engine; and
    acquisition means for acquiring information indicative of an amount of the discharge current from the battery when the detected voltage of the battery becomes a minimum due to starting the engine,
    wherein the acquisition means comprises discharge current estimating means for estimating a difference between the amount of the discharge current before starting the engine and the amount of the discharge current when the detected voltage becomes the minimum due to starting the engine, based on the detected voltage and current, the difference being estimated as a maximum discharge current amount of the battery necessary for starting the engine.

2. The apparatus of claim 1, wherein the discharge current estimating means includes means for estimating, based on the detected voltage and current, an internal resistance of the battery in a period of time lasting until the voltage of the battery reaches a minimum voltage due to starting the engine, and means for estimating the maximum discharge current amount in accordance with the estimated internal resistance of the battery.

3. An apparatus for estimating a charged state of a vehicle provided with an internal combustion engine having a crankshaft, a starter that initially rotates the crankshaft when the engine is started, and a battery that powers the starter, comprising:

detection means for detecting a voltage of the battery and a discharge current from the battery for a period of time ranging time instants before and after starting the engine; and acquisition means for acquiring information indicative of an amount of the discharge current from the battery when the detected voltage of the battery becomes a minimum due to starting the engine, wherein the acquisition means comprises discharge current estimating means for estimating a difference between the amount of the discharge current before starting the engine and the amount of the discharge current when the detected voltage becomes the minimum due to starting the engine, based on the detected voltage and current the difference being estimated as a maximum discharge current amount of the battery necessary the engine;

the detected voltage and current is composed of a plurality of pairs of detected voltage and current; and the discharge current estimating means includes means for calculating a difference between the detected voltage given before starting the starter and a minimum value of the detected voltage which appears in response to starting the starter;

means for calculating a maximum drop amount of the voltage of the battery based on the difference of the voltage;

means for estimating an internal resistance of the battery based on the plurality of pairs of detected voltage and current; and means for estimating the maximum discharge current amount based on the estimated internal resistance and the calculated maximum drop amount.

4. The apparatus of claim 1, wherein the detected voltage and current is composed of a plurality of pairs of detected voltage and current and the discharge current estimating means includes means for estimating an internal resistance of the battery based on, of the plurality of pairs of detected voltage and current, a plurality of pairs of voltage and current detected after the voltage of the battery decreased down to a minimum voltage thereof due to starting the starter;

means for estimating a difference between values of an open-end voltage of the battery appearing before and after starting the starter based on the estimated internal resistance and the detected voltage and current; and means for estimating an internal resistance of the battery appearing when the voltage of the battery decreased down to a minimum voltage thereof based on the estimated difference of the open-end voltage and the estimated internal resistance.

5. An apparatus for estimating a charged state of a vehicle provided with an internal combustion engine having a crankshaft, a starter that initially rotates the crankshaft when the engine is started, and a battery that powers the starter, comprising:

detection means for detecting a voltage of the batter and a discharge current from the battery for a period of time ranging time instants before and after starting the engine; and acquisition means for acquiring information indicative of an amount of the discharge current from the battery when the detected voltage of the battery becomes a minimum due to starting the engine, wherein the acquisition means comprises discharge current estimating means for estimating a difference between the amount of the discharge current before starting the engine and the amount of the discharge current when the detected voltage becomes the minimum due to starting the engine, based on the detected voltage and current, the difference being estimated as a maximum discharge current amount of the battery necessary for starting the engine;

the detected voltage and current is composed of a plurality of pairs of detected voltage and current; and the discharge current estimating means includes means for estimating an internal resistance of the battery based on a plurality of pairs of voltage and current which are detected in a predetermined period of time followed by an event where the voltage of the battery decreases down to a minimum voltage due to starting the starter, means for calculating a difference between the detected voltage provided before starting the starter and a minimum value of the detected voltage which appears in response to starting the starter, means for calculating a maximum drop amount of the voltage of the battery based on the difference of the voltage, and means for estimating the maximum discharge current amount based on the calculated maximum drop amount and the calculated internal resistance, the predetermined period of time is set to a period of time during which it is assumed that the internal resistance of the battery approximates a value appearing in a period of time during which the voltage of the battery decreases down to a minimum voltage due to starting the starter.

6. The apparatus of claim 1, wherein the detected voltage and current is composed of a plurality of pairs of detected voltage and current and the discharge current estimating means includes means for estimating an internal resistance of the battery based on a plurality of pairs of voltage and current which are detected in a predetermined period of time followed by an event where the voltage of the battery decreases down to a minimum voltage due to starting the starter, and means for estimating the maximum discharge current amount based on the minimum voltage of the battery and the estimated internal resistance, wherein the predetermined period of time is set to a period of time which gives an assumption that the internal resistance of the battery approximates a value given by a gradient of an arithmetic line defined an event where the voltage of the battery decreases down to a minimum voltage due to starting the starter and an event the voltage of the battery recovers up to a specific value.

7. The apparatus of claim 1, further comprising
prediction means for predicting a minimum value of the voltage of the battery which is to be caused when the starter is activated for starting the engine at present, on the basis of the estimated maximum discharge current amount and the detected voltage of the battery.

8. The apparatus of claim 7, wherein
the discharge current estimating means comprises memory means previously storing the estimated maximum discharge current amount, one by one correspondence, every divided range of at least one of a discharge capacity of the battery and temperature of the battery, and
the prediction means predicts the minimum value of the voltage based on the maximum discharge current amount corresponding to a specified range of the divided ranges, the specified range corresponding to a current state of the at least one of the discharge capacity and the temperature.

9. An apparatus for estimating a charged state of a vehicle, provided with an internal combustion engine having a crankshaft, a starter that initially rotates the crankshaft when the engine is started, and a battery that powers the starter, comprising:
detection means for detecting of the battery and a discharge current from the battery for a period of time ranging time instants before and after starting the engine; and
acquisition means for information indicative of an amount of the discharge current from the battery when the detected voltage of the battery becomes a minimum due to trig the engine, wherein
the acquisition means comprises discharge current estimating means for estimating a difference between the amount oldie discharge current before starting the engine and the amount of the discharge current when the detected voltage becomes the minimum due to starting the en sine based on the detected voltage and current, the difference being estimated as a maximum discharge current amount of the battery necessary for starting the engine;
the discharge current estimating means includes means for estimating, based on the detected voltage and current, an internal resistance of the battery in a period of time lasting until the voltage of the battery reaches a minimum voltage due to starting the engine, and means for estimating the maximum discharge current amount in accordance with the estimated internal resistance of the battery;
the detected voltage and current is composed of a plurality of pairs of detected voltage and current and
the discharge current estimating means includes
means for calculating a difference between the detected voltage given before starting the starter and a minimum value of the detected voltage which appears in response to starting the starter;
means for calculating a maximum drop amount of the voltage of the battery based on the difference of the voltage;
means for estimating an internal resistance of the battery based on the plurality of pairs of detected voltage and current; and
means for estimating the maximum discharge current amount based on the estimated internal resistance and the calculated maximum drop amount.

10. The apparatus of claim 2, wherein
the detected voltage and current is composed of a plurality of pairs of detected voltage and current and
the discharge current estimating means includes
means for estimating an internal resistance of the battery based on, of the plurality of pairs of detected voltage and current, a plurality of pairs of voltage and current detected after the voltage of the battery decreased down to a minimum voltage thereof due to starting the starter;
means for estimating a difference between values of an open-end voltage of the battery appearing before and after starting the starter based on the estimated internal resistance and the detected voltage and current; and
means for estimating an internal resistance of the battery appearing when the voltage of the battery decreased down to a minimum voltage thereof based on the estimated difference of the open-end voltage and the estimated internal resistance.

11. An apparatus for estimating a charged state of a vehicle provided with an internal combustion engine having a crankshaft, a starter that initially rotates the crankshaft when the engine is started, and a batter that powers the starter, comprising:
detection means for detecting a voltage of the battery and a discharging current from the batter for a period of time ranging time instants before and after starting the engine; and
acquisition means for acquiring information indicative of an amount of the discharge current from the battery when the detected voltage of the battery becomes a minimum due to starting the engine, wherein
the acquisition means comprises discharge current estimating means for estimating a difference between the amount of the discharge current before starting the engine and the amount of the discharge current when the detected voltage becomes the minimum due to starting the engine, based on the detected voltage and current, the difference being estimated as a maximum discharge current amount of the battery necessary for starting the engine;
the discharge current estimating means includes means for estimating, based on the detected voltage and current, an internal resistance of the battery in a period of time lasting until the voltage of the battery reaches a minimum voltage due to starting the engine, and means for estimating the maximum discharge current amount in accordance with the estimated internal resistance of the battery;
the detected voltage and current is composed of a plurality of pairs of detected voltage and current; and
the discharge current estimating means includes
means for estimating an internal resistance of the battery based on a plurality of pairs of voltage and current which are detected in a predetermined period of time followed by an event where the voltage of the battery decreases down to a minimum voltage due to starting the starter,
means for calculating a difference between the detected voltage given before starting the starter and a minimum value of the detected voltage which appears in response to starting the starter,
means for calculating a maximum drop amount of the voltage of the battery based on the difference of the voltage, and
means for estimating the maximum discharge current amount based on the calculated maximum drop amount and the calculated internal resistance,
the predetermined period of time is set to a period of time which gives an assumption that the internal resistance of the battery approximates a value appearing in a period of time during which the voltage of the battery decreases down to a minimum voltage due to starting the starter.

12. The apparatus of claim 2, further comprising
prediction means for predicting a minimum value of the voltage of the battery which is to be caused when the starter is activated for starting the engine at present, on the basis of the estimated maximum discharge current amount and the detected voltage of the battery.

13. The apparatus of claim 12, wherein
the discharge current estimating means comprises memory means previously storing the estimated maximum discharge current amount, one by one correspondence, every divided range of at least one of a discharge capacity of the battery and temperature of the battery, and
the prediction means predicts the minimum value of the voltage based on the maximum discharge current amount corresponding to a specified range of the divided ranges, the specified range corresponding to a current state of the at least one of the discharge capacity and the temperature.

14. The apparatus of claim 1, further comprising
prediction means for predicting a minimum value of the voltage of the battery which is to be caused when the starter is activated for starting the engine at present, on the basis of the estimated maximum discharge current amount and the detected voltage of the battery.

15. The apparatus of claim 14, wherein
the discharge current estimating means comprises memory means previously storing the estimated maximum discharge current amount, one by one correspondence, every divided range of at least one of a discharge capacity of the battery and temperature of the battery, and
the prediction means predicts the minimum value of the voltage based on the maximum discharge current amount corresponding to a specified range of the divided ranges, the specified range corresponding to a current state of the at least one of the discharge capacity and the temperature.

16. An automatic stop and start control apparatus, comprising
an apparatus for estimating a charged state of a battery of a vehicle provided with an internal combustion engine having a crankshaft and a starter that initially rotates the crankshaft when the engine is started, the battery powering the starter,
wherein the estimating apparatus comprises
detection means for detecting a voltage of the battery and a discharge current from the battery for a period of time over time instants before and after starting the engine;
acquisition means for acquiring information indicative of an amount of the discharge current from the battery when the detected voltage of the battery becomes a minimum due to starting the engine, wherein the acquisition means comprises discharge current estimating means for estimating a difference between the amount of the discharge current before starting the engine and the amount of the discharge current when the detected voltage becomes the minimum due to starting the engine, based on the detected voltage and current, the difference being estimated as a maximum discharge current amount of the battery necessary for starting the engine; and
prediction means for predicting a minimum value of the voltage of the battery which is to be caused when the starter is activated for starting the engine at present, on the basis of the estimated maximum discharge current amount and the detected voltage of the battery; and
means for performing at least one of an automatic stop process and an automatic start process based on the minimum value of the voltage of the battery predicted by the prediction means.

17. The apparatus of claim 16, wherein
the discharge current estimating means comprises memory means previously storing the estimated maximum discharge current amount, one by one correspondence, every divided range of at least one of a discharge capacity of the battery and temperature of the battery, and
the prediction means predicts the minimum value of the voltage based on the maximum discharge current amount corresponding to a specified range of the divided ranges, the specified range corresponding to a current state of the at least one of the discharge capacity and the temperature.

18. An apparatus for estimating a charged state of a battery of a vehicle provided with an internal combustion engine having a crankshaft and a starter that initially rotates the crankshaft when the engine is started, the battery powering the starter, comprising:
a detection unit that detects a voltage of the battery and a discharge current from the battery for a period of time over time instants before and after starting the engine; and
an acquisition unit that acquires information indicative of an amount of the discharge current from the battery when the detected voltage of the battery becomes a minimum due to starting the engine;
wherein the acquisition unit comprises a discharge current estimating device that estimates a difference between the amount of the discharge current before starting the engine and the amount of the discharge current when the detected voltage becomes the minimum due to starting the engine, based on the detected voltage and current, the difference being estimated as a maximum discharge current amount of the battery necessary for starting the engine.

* * * * *